(12) United States Patent
Brambilla et al.

(10) Patent No.: US 6,392,393 B1
(45) Date of Patent: May 21, 2002

(54) CONTROLLED CURRENT, VOLTAGE MODE DRIVING STAGE

(75) Inventors: Davide Brambilla, Rho; Giovanni Capodivacca, Castellanza; Danilo Ranieri, Sesto San Giovanni, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/594,244

(22) Filed: Jun. 15, 2000

(30) Foreign Application Priority Data

Jun. 15, 1999 (EP) .............................. 99830369

(51) Int. Cl.[7] .............................................. G05F 3/16
(52) U.S. Cl. ....................................... 323/315; 323/273
(58) Field of Search ............................... 323/273, 311, 323/312, 313, 315; 330/257

(56) References Cited

U.S. PATENT DOCUMENTS

| 4,258,406 A | | 3/1981 | Seki | 361/79 |
|---|---|---|---|---|
| 4,599,578 A | | 7/1986 | Seevinck | 330/298 |
| 5,084,668 A | | 1/1992 | Kotowski et al. | 323/315 |
| 5,225,766 A | * | 7/1993 | O'Neill | 323/273 |
| 5,929,623 A | * | 7/1999 | Hoshino | 323/315 |
| 6,150,799 A | * | 11/2000 | Barth et al. | 323/273 |
| 6,181,202 B1 | * | 1/2001 | Yamasaki | 330/257 |

* cited by examiner

Primary Examiner—Peter S. Wong
Assistant Examiner—Gary L. Laxton
(74) Attorney, Agent, or Firm—Lisa K. Jorgenson; Allen Dyer, Doppelt, Milbrath & Gilchrist, P.A.

(57) ABSTRACT

A method of voltage driving a load using a controlled current includes providing a negative feedback of an output current, measuring the output current on a collector of an output transistor of an output stage, comparing the measured output current with an input current to define a current difference, and providing the current difference at a base of the output transistor to provide the voltage driving.

14 Claims, 4 Drawing Sheets

US 6,392,393 B1

CONTROLLED CURRENT, VOLTAGE MODE DRIVING STAGE

FIELD OF THE INVENTION

The present invention relates to field of integrated circuits and, more particularly, to output power stages.

BACKGROUND OF THE INVENTION

The invention is directed to a current controlled output stage for driving a load in a voltage mode under normal conditions and in a current mode when the load requires a particularly high current. An output stage of the prior art is illustrated in FIG. 1, in which the load is normally driven in the voltage mode (Vb=Va). When the current absorbed by the load becomes excessive, the driving is automatically controlled in the current mode (I0=K*In).

In certain instances, the output stage may be used to drive a load with a controlled current, i.e., a smaller current than that which could be absorbed by the external load if the delivered current was not otherwise specifically controlled. Furthermore, it is often necessary to provide a full output voltage swing and the ability to meet output voltage constraints both below ground and above supply voltages due to particular operating conditions or noise induced by the load.

As a result of this need for an extended range of operating voltages (e.g., in the car radio segment), it is necessary to provide driving stages with a low voltage drop. For this purpose, a circuit such as the one illustrated in FIG. 2 would traditionally be used, for example. Those of skill in the art will appreciate that voltage mode driving (from node A to node B) is provided by the illustrated circuit, which automatically becomes current mode driving whenever the load requires a current greater than Hfe*Iin (where Hfe is the current gain of the transistor T1). The input variables of the circuit are the voltage provided at the node A by a circuit proceeding the output stage (not shown) and the current Iin, which is provided by a circuit preceding the output stage (also not shown).

The above approach is disadvantageous because the output current depends to a significant extent upon the parameters of the manufacturing process and temperature, as well as the level of the signal itself. Furthermore, this relationship is not of a linear nature because of the variability of the Hfe parameter of the transistor T1, which depends upon the collector current. The output stage illustrated in FIG. 2 may develop output voltages below ground and above the supply voltage. It is only able to drive loads connected to ground, and to deliver and absorb current it must be associated with a corresponding dual structure.

SUMMARY OF THE INVENTION

An object of the present invention is to provide an improved driving method and an associated output stage that provides low voltage drop and a wide range of operating voltage characteristics (from below ground values to above supply values), improved current control with relatively small input currents, and which is less affected by processing and temperature variations than the prior art, all irrespective of the level of the input voltage signal.

According to the present invention, a method of voltage driving with controlled current includes providing a negative feedback of an output current measured on a collector of a transistor of the output stage, comparing the current measured at the collector with the input current, and providing the difference therebetween at the base of the transistor to provide the voltage driving.

The collector is coupled to the input of a feedback current mirror, which in turn is coupled to a supply rail of opposite sign than a rail to which the load is coupled. The output of the feedback current mirror is coupled to a first node at which the input current and the current of the collector are compared. This comparison results in a current difference that is forced, by way of a first current mirror coupled to a diode, onto a second node at which the input voltage signal of the output stage is produced.

DETAILED DESCRIPTION OF THE PREFERRED EMBODIMENTS

Figure 1:
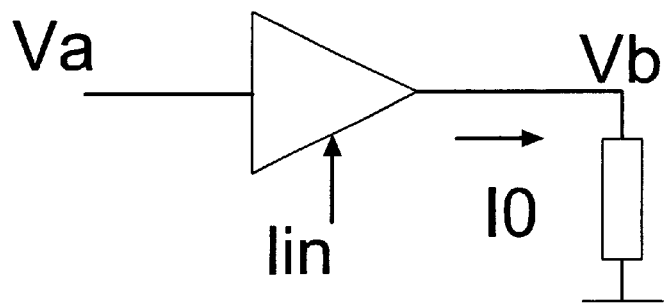
FIG. 1 is a schematic diagram illustrating a basic scheme of an output stage according to the prior art for voltage driving a load with a controlled current, as discussed above.
Figure 2:
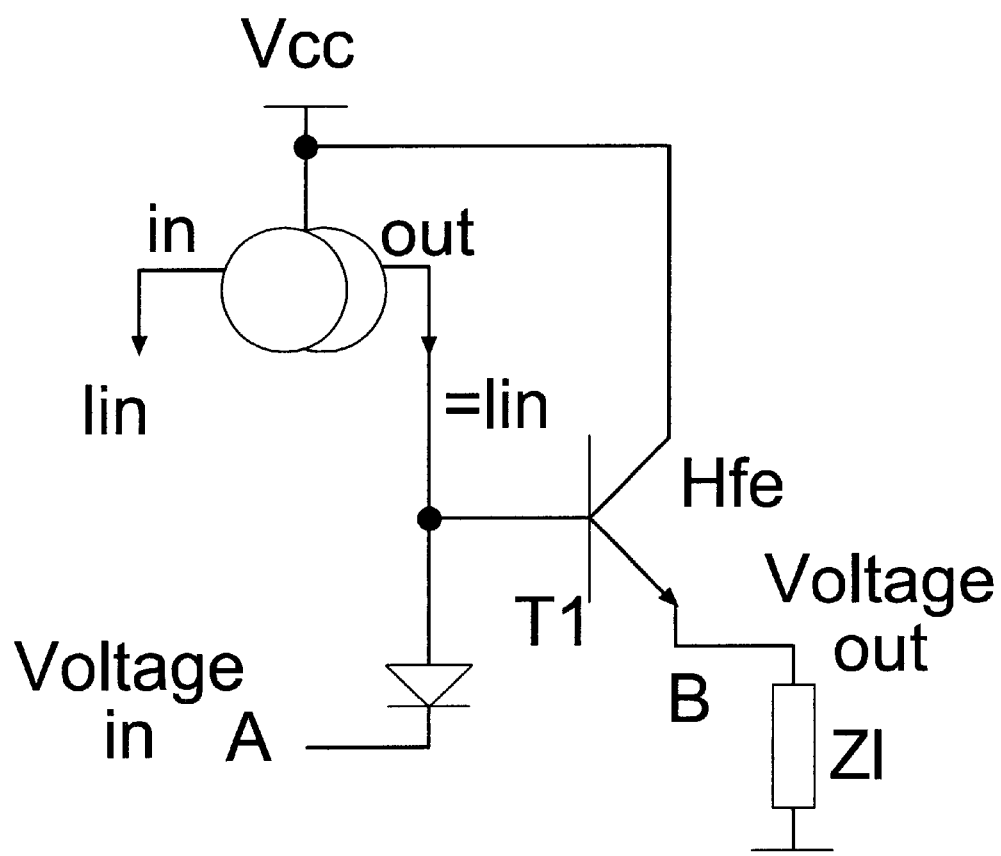
FIG. 2 is a detailed schematic diagram of a prior art output stage according to FIG. 1.

The circuit of FIG. 2 illustrates a fully complementary output stage of the prior art which is used to maximize efficiency and output voltage swing. In contrast, a basic unipolar circuit according to the present invention is illustrated with reference to FIG. 3a. Under normal load conditions (i.e., when the current delivered to the load Z1 is sufficient to fully cover the current absorbed by the load), the diode D1 is turned on (because the output current is less than a maximum limit) to enable voltage driving at the base of the output transistor T1. Thus, the load is driven in voltage mode. In this operating condition, any excess current at the base of the transistor is absorbed by the circuit that precedes the voltage input node A of the output stage (not shown).

Figure 3:
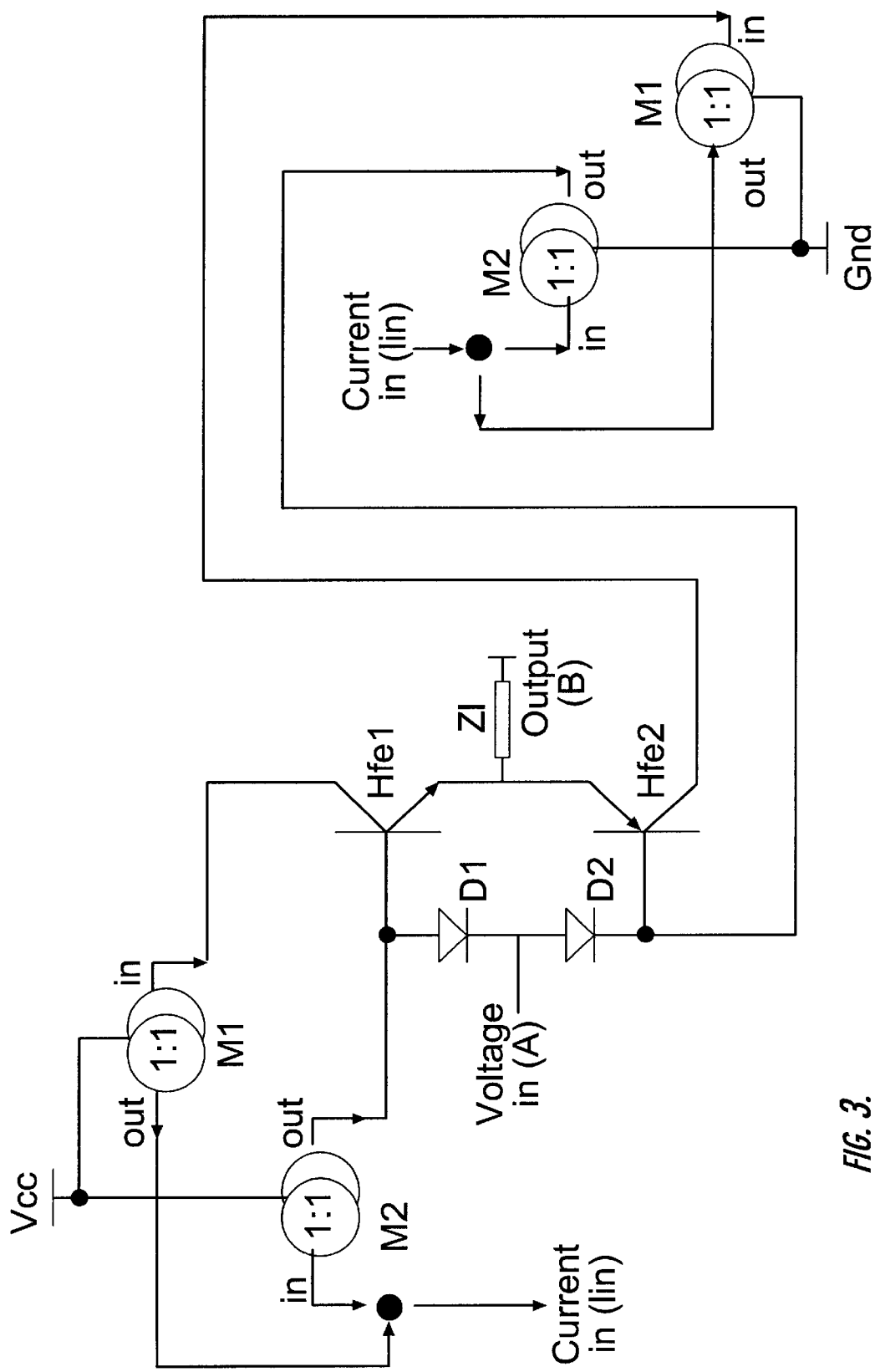
FIG. 3 is a schematic diagram of a fully complementary output stage according to the present invention.
Figure 3B:
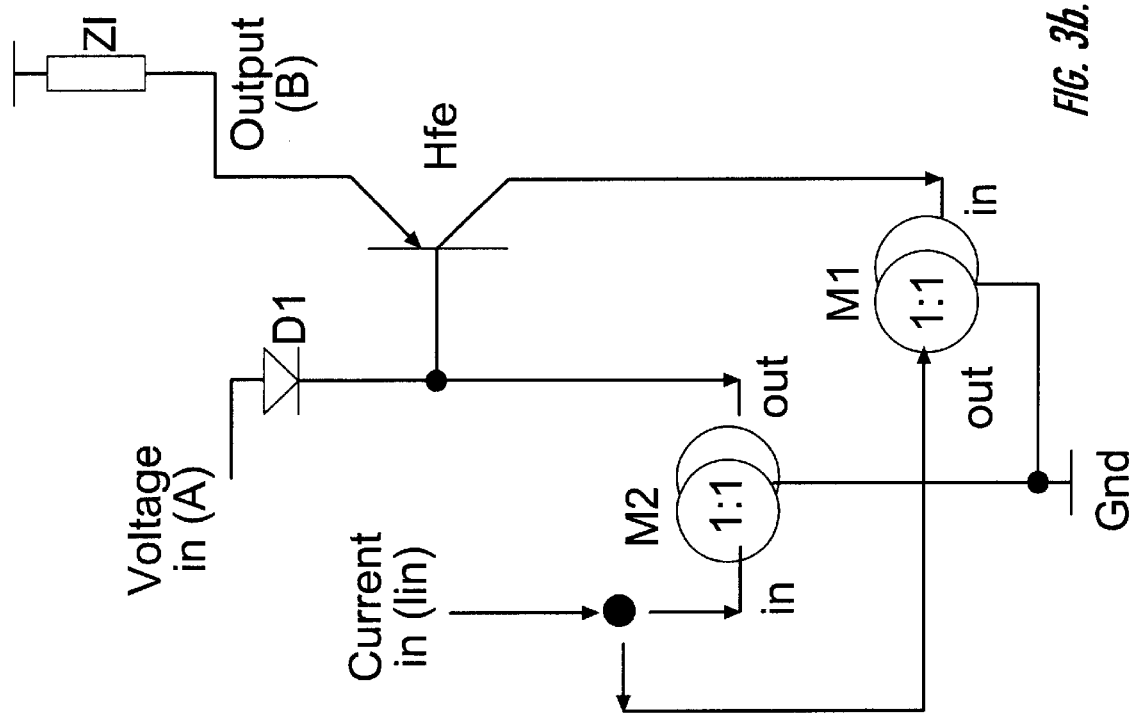
FIG. 3b is a schematic diagram showing a dual version of the circuit of FIG. 3a that is capable of driving a load coupled to the positive supply rail instead of to ground.
Figure 3A:
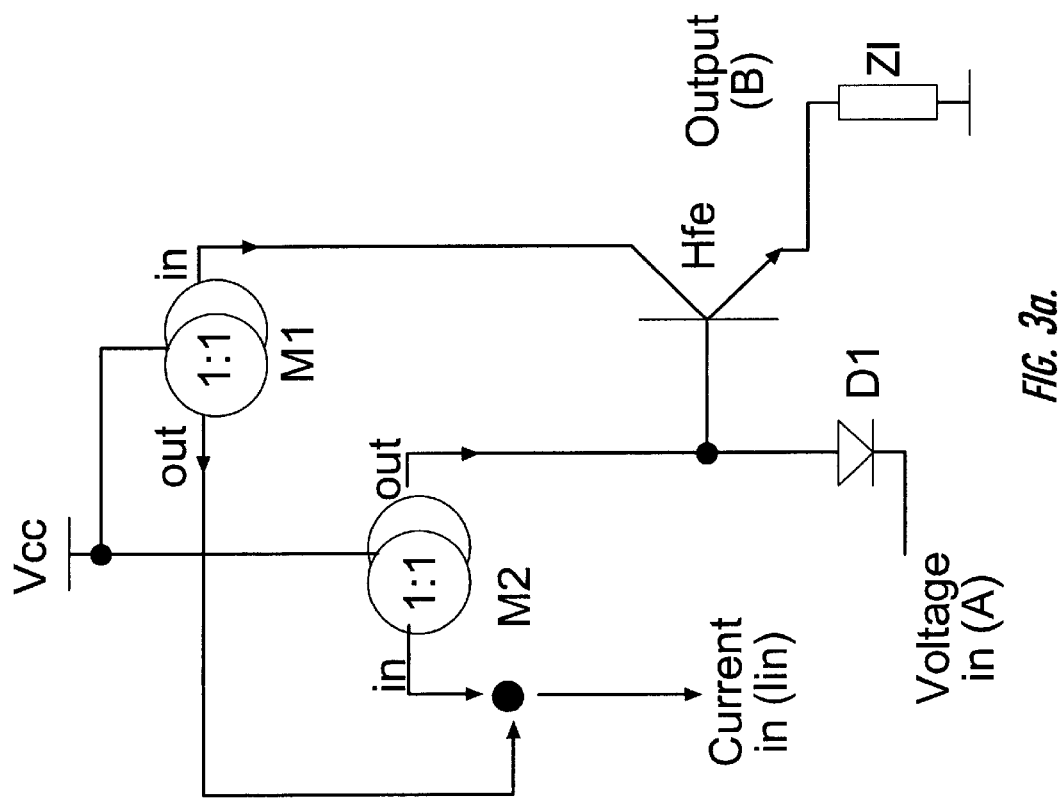
FIG. 3a is a schematic diagram of a unipolar stage of the invention capable only of delivering current to a load.

When the output current becomes insufficient to satisfy the current requisite of the load (that is, when the output current exceeds the maximum limit), the diode D1 is reverse biased. As a result, the output stage remains under closed loop control through the negative feedback of the current at the collector of the output transistor T1. This ensures that the current delivered to the load will be controlled according to I0=K*Iin, where in the illustrated example K=1, i.e., the current gain of the output stage is equal to one. The circuit illustrated in FIG. 3b is functionally similar to that of FIG. 3a. The circuit of FIG. 3b represents a dual version of the circuit of FIG. 3a for driving a load coupled to a positive supply voltage node instead of to ground.

Figure 4:
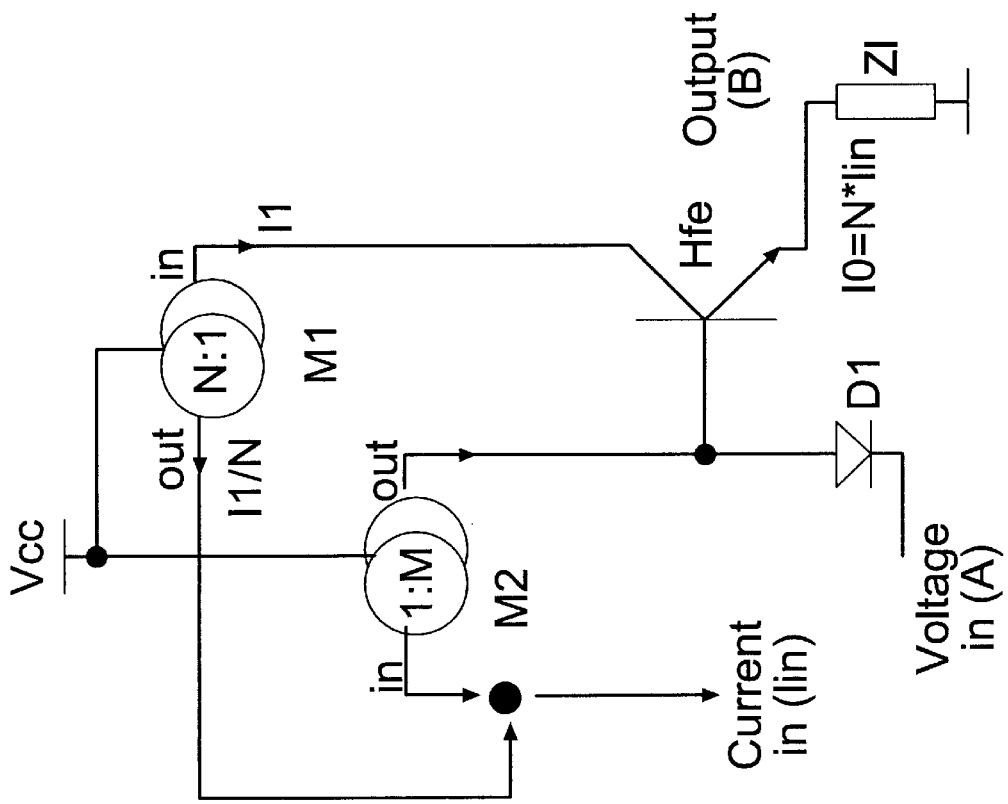
FIG. 4 is a schematic diagram of another embodiment of an output stage according to the present invention.

An alternative embodiment according to the present invention is illustrated in FIG. 4. This embodiment is useful in applications requiring a current gain greater than 1, i.e., when K=N (N>1). A proper current mirroring ratio should be used in monitoring the collector current of the output NPN transistor (i.e., feedback current mirror M1). The current gain corresponds to the reciprocal of the current mirroring ratio of the feedback mirror M1. It may be necessary to provide for a certain gain of the current mirror M2 located in the direct path of the current signal to obtain the desired loop gain.

Figure 5:
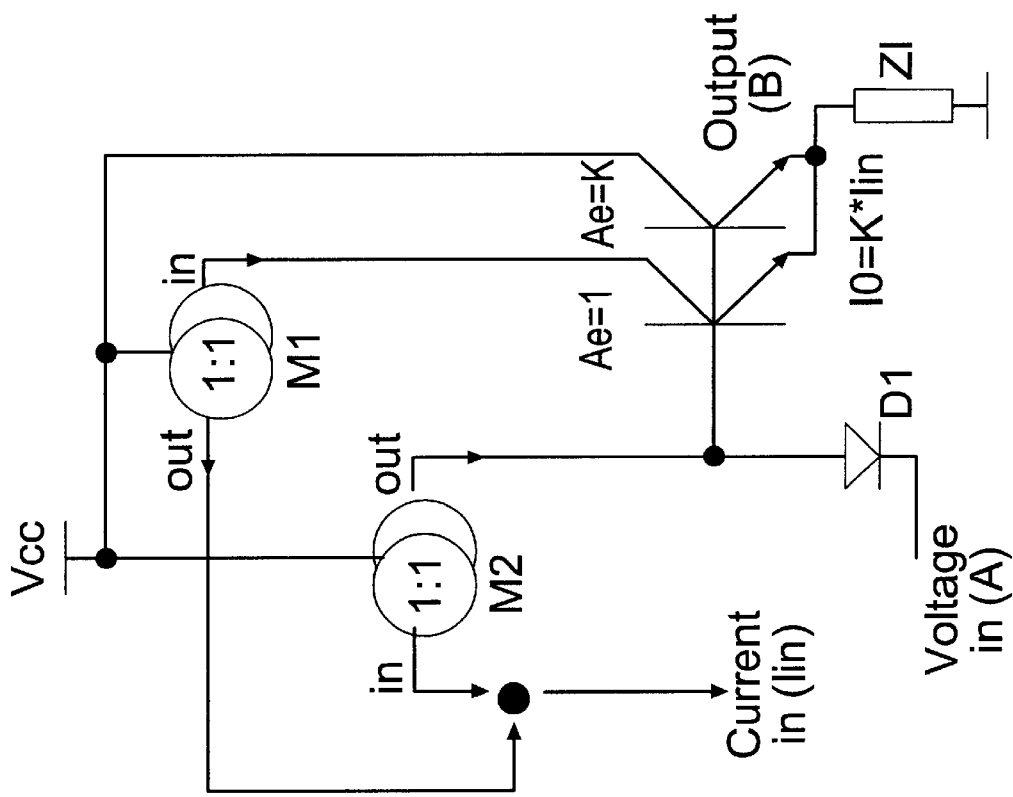
FIG. 5 is a schematic diagram of yet another embodiment of an output stage according to the present invention.

Yet another alternative embodiment of the present invention is shown in FIG. 5. This embodiment saves integration area by implementing the feedback loop using a feedback current mirror M1. Here, the current mirror M1 does not need to monitor the entire collector current of the output transistor, just a fractional portion thereof, which occurs at a suitably scaled structure of the output transistor. Given that the feedback current mirror M1 typically includes PNP transistors, a considerable savings of integration area may be achieved, as will be appreciated by one of skill in the art. Thus, it is possible to use a low current reference (because the gain current is lower than 1) and a smaller silicon area will be required to realize the current mirror of the feedback loop.

Naturally, the alternative embodiments of the basic circuit of the invention of FIGS. 4 and 5 may be implemented in a fully complementary version, similar to that illustrated in FIG. 2.

That which is claimed is:

1. A driving stage for voltage driving a load with a controlled current where the load is coupled to a first voltage reference, the driving stage comprising:
    at least one transistor having an emitter coupled to the load, a collector coupled to a second voltage reference, and a base;
    a first current mirror having an input coupled to an input current and an output coupled to the base of said at least one transistor;
    a diode coupling the output of said first current mirror to an input voltage source when the diode is forward biased;
    a second current mirror having an input coupled to the collector of said at least one transistor and an output coupled to the input current for comparing the input current and a current of the collector mirrored by said second current mirror to obtain a current difference therebetween; and
    a circuit for supplying current to or absorbing current from the base of said at least one transistor responsive to the current difference and for supplying current to or absorbing current from the input voltage source through said diode also responsive to the current difference.

2. The driving stage of claim 1 wherein the first voltage reference comprises ground and the second voltage reference comprises a supply voltage.

3. The driving stage of claim 1 wherein the first voltage reference comprises a supply voltage and the second voltage reference comprises ground.

4. The driving stage of claim 1 wherein said second current mirror has a mirroring ratio less than 1.

5. The driving stage of claim 1 wherein said first current mirror has a mirroring ratio greater than 1.

6. The driving stage of claim 1 wherein said second current mirror mirrors a fraction of the current of the collector of said at least one transistor.

7. A driving stage for voltage driving a load with a controlled current where the load is coupled to a first voltage reference, the driving stage comprising:
    at least one transistor having an first conduction terminal coupled to the load, a second conduction terminal coupled to a second voltage reference, and a control terminal;
    a first current mirror having an input coupled to an input current and an output coupled to the control terminal of the at least one transistor;
    a second current mirror having an input coupled to the second conduction terminal of said at least one transistor and an output coupled to the input current for comparing the input current and a current of the second conduction terminal mirrored by said second current mirror to obtain a current difference therebetween; and
    a circuit for supplying current to or absorbing current from the control terminal of said at least one transistor responsive to the current difference and for supplying current to or absorbing current from the input voltage source also responsive to the current difference.

8. The driving stage of claim 7 wherein said at least one transistor comprises at least one bipolar transistor having an emitter defining the first conduction terminal, a collector defining the second conduction terminal, and a base defining the control terminal.

9. The driving stage of claim 7 further comprising a diode coupling the output of said first current mirror to an input voltage when the diode is forward biased; and wherein the circuit supplies current to or absorbs current from the input voltage through said diode.

10. The driving stage of claim 7 wherein the first voltage reference comprises ground and the second voltage reference comprises a supply voltage.

11. The driving stage of claim 7 wherein the first voltage reference comprises a supply voltage and the second voltage reference comprises ground.

12. The driving stage of claim 7 wherein said second current mirror has a mirroring ratio less than 1.

13. The driving stage of claim 7 wherein said first current mirror has a mirroring ratio greater than 1.

14. The driving stage of claim 7 wherein said second current mirror mirrors less than the entire current of the second conduction terminal of said at least one transistor.

* * * * *